United States Patent
Maeda et al.

(10) Patent No.: US 8,244,399 B2
(45) Date of Patent: Aug. 14, 2012

(54) TRANSPORT METHOD AND TRANSPORT APPARATUS

(75) Inventors: Hidehiro Maeda, Tokyo (JP); Kazuya Okamoto, Tokyo (JP); Yasuaki Tanaka, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/644,615

(22) Filed: Dec. 22, 2009

(65) Prior Publication Data

US 2010/0168908 A1 Jul. 1, 2010

Related U.S. Application Data

(63) Continuation of application No. PCT/JP2008/061267, filed on Jun. 19, 2008.

(30) Foreign Application Priority Data

Jun. 21, 2007 (JP) .................. 2007-164081

(51) Int. Cl.
*G06F 7/00* (2006.01)
*G06F 19/00* (2011.01)
*H01L 21/68* (2006.01)
*H01L 23/544* (2006.01)
*B29C 65/00* (2006.01)
*G01B 11/00* (2006.01)

(52) U.S. Cl. ........ 700/213; 700/228; 700/214; 700/108; 700/227; 414/783; 414/217; 356/399; 356/400; 356/401; 156/60; 355/77; 257/797

(58) Field of Classification Search .................. None
See application file for complete search history.

(56) References Cited

U.S. PATENT DOCUMENTS 5,563,798 A * 10/1996 Berken et al. .................. 700/218
6,636,313 B2 * 10/2003 Chen et al. ..................... 356/401

(Continued)

FOREIGN PATENT DOCUMENTS

| JP | 2005-302858 A | 10/2005 |
| JP | 2005302858 A * | 10/2005 |
| JP | 2006-203145 A | 8/2006 |
| JP | 2006-248895 A | 9/2006 |
| WO | WO 2005/054147 A1 | 6/2005 |

(Continued)

*Primary Examiner* — Gene Crawford
*Assistant Examiner* — Yolanda Jones
(74) *Attorney, Agent, or Firm* — Finnegan, Henderson, Farabow, Garrett & Dunner, L.L.P.

(57) ABSTRACT

Provided is a transport method comprising judging whether there is a possibility that misalignment greater than or equal to a threshold value occurs between substrates to be layered that are held by a pair of substrate holders aligned and stacked by an aligning section, the misalignment occurring when the pair of substrate holders is transported from the aligning section to a pressure applying section; and if the judgment indicates that there is the possibility of misalignment, transporting the pair of substrate holders to a region other than the pressure applying section. Whether there is the possibility of misalignment may be judged based on acceleration of the substrate holders. Whether there is the possibility of misalignment may be judged based on acceleration of a transporting section that transports the substrate holders. Whether there is the possibility of misalignment may be judged based on relative positions of the substrate holders. Whether there is the possibility of misalignment may be judged based on relative positions of (i) a transporting section that transports the pair of substrate holders and (ii) one of the pair of substrate holders.

42 Claims, 12 Drawing Sheets

U.S. PATENT DOCUMENTS

| | | | |
|---|---|---|---|
| 7,385,700 B2 * | 6/2008 | Matsumoto et al. | 356/401 |
| 2005/0016818 A1 * | 1/2005 | Ito et al. | 198/345.1 |
| 2006/0162660 A1 | 7/2006 | Shimizu | |
| 2006/0249859 A1 * | 11/2006 | Eiles et al. | 257/797 |
| 2007/0111471 A1 | 5/2007 | Okada | |
| 2008/0056857 A1 * | 3/2008 | Hiroki | 414/217.1 |
| 2008/0223298 A1 | 9/2008 | Shimizu | |
| 2009/0123853 A1 * | 5/2009 | Arai | 430/5 |

\* cited by examiner

TRANSPORT METHOD AND TRANSPORT APPARATUS

BACKGROUND

1. Technical Field

The present invention relates to a transport apparatus and a transport method. In particular, the present invention relates to a transport method of a substrate holder during manufacturing of a layered 3-dimensional semiconductor apparatus and an apparatus that realizes this transport method. The present patent application claims priority based on Japanese Patent Publication Application No. 2007-164081 filed on Jun. 21, 2007, the contents of which are incorporated herein by reference.

2. Related Art

Techniques are advancing for bonding substrates, wafers, and the like to each other during manufacturing of a device having a stereoscopic structure such as a MEMS or a layered 3-dimensional semiconductor apparatus having layered wafer levels. The development of apparatuses used for this purpose is also progressing. For example, see Japanese Patent Application Publication No. 2005-302858. With such a bonding apparatus, when transporting a temporarily fixed layered wafer body, transportation conditions are adopted so as not to cause misalignment between the wafers.

Regarding the transport conditions of the bonding apparatus, if misalignment is caused for some reason after two wafers are aligned and the misaligned wafers then undergo electrode bonding by a pressure applying and heating process, the resulting layered semiconductor apparatus does not function properly, which causes a drop in the yield when manufacturing semiconductor apparatuses. Therefore, transport of the aligned wafers without causing misalignment is desired, and so is detection of misalignment between the wafers prior to the pressure applying and heating process.

SUMMARY

Therefore, according to a first aspect related to the innovations herein, one exemplary transport method may comprise judging whether there is a possibility that misalignment greater than or equal to a threshold value occurs between substrates to be layered that are held by a pair of substrate holders aligned and stacked by an aligning section, the misalignment occurring when the pair of substrate holders is transported from the aligning section to a pressure applying section; and if the judgment indicates that there is the possibility of misalignment, transporting the pair of substrate holders to a region other than the pressure applying section.

According to a second aspect related to the innovations herein, one exemplary transport apparatus may include a transport apparatus that transports a pair of substrate holders, which are aligned and stacked by an aligning section and hold substrates to be layered, from the aligning section to a pressure applying section, comprising a control section that (i) judges whether there is a possibility of misalignment greater than or equal to a threshold value occurring between the substrates, the misalignment occurring during transport from the aligning section to the pressure applying section, and (ii) if the judgment indicates the possibility of misalignment, causes the pair of substrate holders to be transported to a region other than the pressure applying section.

According to a third aspect related to the innovations herein, one exemplary transport method may comprise judging whether there is a possibility that misalignment greater than or equal to a threshold value occurs between substrates aligned and stacked by an aligning section, the misalignment occurring when the pair of substrates is transported from the aligning section to a pressure applying section; and if the judgment indicates that there is the possibility of misalignment, transporting the pair of substrates to a region other than the pressure applying section.

According to a fourth aspect related to the innovations herein, one exemplary transport apparatus may include a transport apparatus that transports a pair of substrates, which are aligned and stacked by an aligning section, from the aligning section to a pressure applying section, comprising a control section that (i) judges whether there is a possibility of misalignment greater than or equal to a threshold value occurring between the substrates, the misalignment occurring during transport from the aligning section to the pressure applying section, and (ii) if the judgment indicates the possibility of misalignment, causes the pair of substrates to be transported to a region other than the pressure applying section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
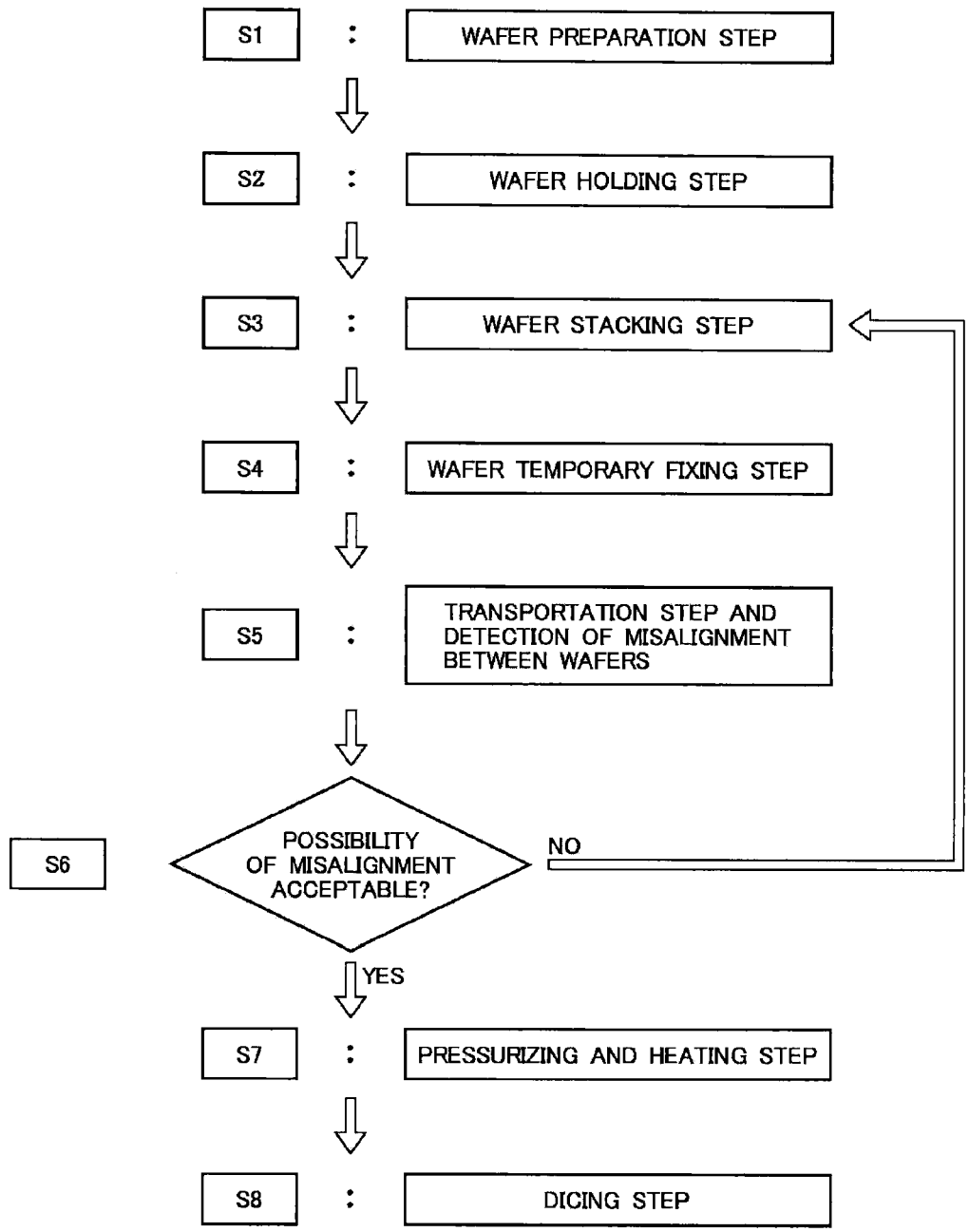
FIG. 1 is a flow chart showing the manufacturing process of a layered 3-dimensional semiconductor apparatus.

FIG. 1 is a flow chart showing the manufacturing process of a layered 3-dimensional semiconductor apparatus. FIGS. 2A, 2B, 2C, 3A, 3B, 3C, and 4 each show a manufacturing apparatus and work occurring at each stage of the manufacturing process shown in FIG. 1. The following uses these Figures to described the process of FIG. 1.

Figure 2A:
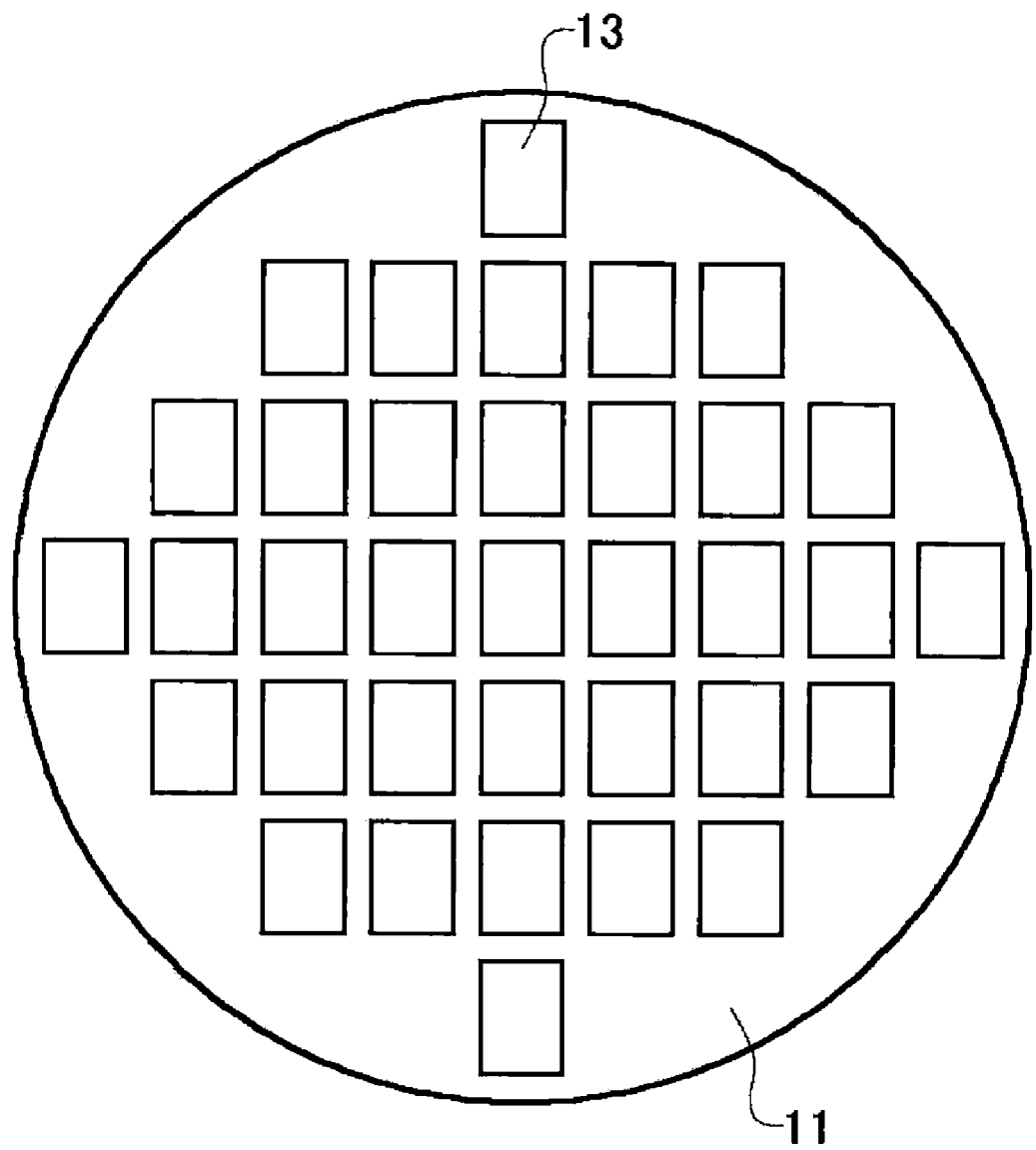
FIG. 2A is a schematic view of one step performed by the manufacturing apparatus.

Wafer Preparation Step (S1):

In the wafer preparation step, a wafer 11 is prepared on which is formed circuit elements implemented in the final chip form, as shown in FIG. 2A. In this step, a wafer 11 is created on which is formed a semiconductor apparatus 13 including transistors, resistors, capacitors, wiring, via-electrodes, and the like, using mainly a lithography technique and also an impurity expansion technique, an etching technique, a thin-film forming technique, or the like.

The wafer 11 is prepared so as to have a number of layers required for forming an IC chip to be ultimately used. Layering of the wafer 11 may begin after the desired number of layers is prepared, or a portion of the layering step may be performed in parallel with the preparation.

Figure 2B:
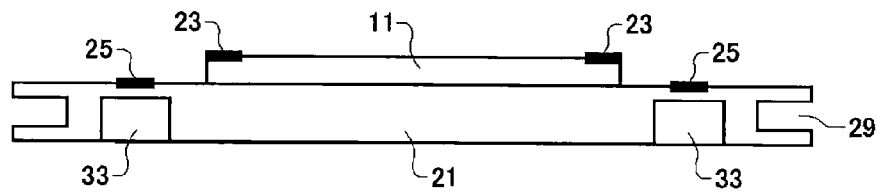
FIG. 2B is a schematic view of one step performed by the manufacturing apparatus.

Wafer Holding Step (S2):

In the wafer holding step (S2), the wafer 11 is held on a wafer holder 21 by electrostatic adsorption, as shown in FIG. 2B. By holding another wafer 11 in another wafer holder 21, the wafer holders 21 can hold a wafer 11 pair made of two stacked wafers 11. The method for holding the wafers 11 is not limited to electrostatic adsorption, and may instead be vacuum suction or the like. One of the held wafers 11 may already have a 3-dimensional structure formed by layering and bonding a plurality of substrates.

In the wafer holding step (S2), the positional relationship between the each pair of a wafer holder 21 and a wafer 11 is recorded by using a microscope or the like to measure an alignment mark 23 on the wafer 11 held by the wafer holder 21 and a reference mark 25 on the wafer holder 21. This record is used in the following step. Furthermore, as described further below, this record is also used when judging whether there is a possibility of misalignment between the wafer 11 and the wafer holder 21.

Figure 2C:
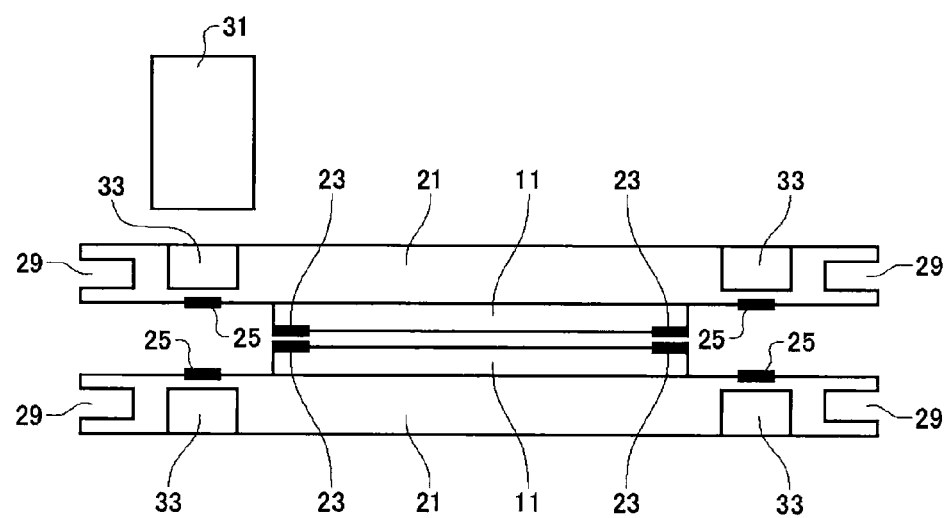
FIG. 2C is a schematic view of one step performed by the manufacturing apparatus.

Wafer Stacking Step (S3):

In the wafer stacking step (S3), the wafers held by the wafer holders 21 are brought near each other with their surfaces opposed to each other, as shown in FIG. 2C. The positional relationship between the reference marks 25 of the wafer holders 21 is monitored by a microscope 31 to measure the positional relationship between corresponding reference marks 25 on the wafer holders 21.

By referencing the positional relationships between the wafer holders 21 and the wafers 11 recorded in the previous step, the relative positions of the reference marks 25 of the wafer holders 21 and the alignment mark 23 of the wafers 11 can be obtained. By moving one of the wafer holders 21 by an appropriate amount relative to the other wafer holder 21 based on these relative positions, the alignment marks 23 on a pair of wafers 11 can be brought into alignment with each other. Each reference mark 25 on each wafer holder 21 is formed on a substrate that is thinly layered over a concave portion 33 formed in the wafer holder 21, such that reference mark 25 can be observed by the microscope 31 or the like from a back surface of the wafer holder 21.

Figure 3A:
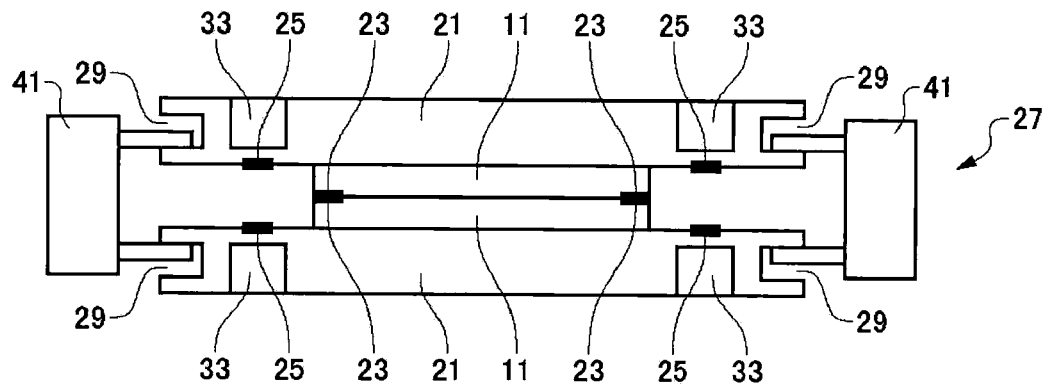
FIG. 3A is a schematic view of one step performed by the manufacturing apparatus.

Wafer Temporary Fixing Step (S4):

In the wafer temporary fixing step (S4), the space between two aligned wafers 11 is narrowed, such that the two wafers 11 are stacked in contact. After stacking the wafers, the pair of wafer holders 21 temporarily affix the wafers 11 to each other by inserting a plurality of temporary fixing apparatuses 41 into concave portions 29 formed on the periphery of the wafer holders 21, as shown in FIG. 3A.

Each temporary fixing apparatus 41 exerts a force perpendicular to the surfaces of the wafers on the wafer holders 21, but does not exert any force parallel to these surfaces. In this way, the two wafers 11 are aligned with each other, and a block 27 is achieved by temporarily fixing the wafers 11 to each other in a contacting state.

Figure 3B:
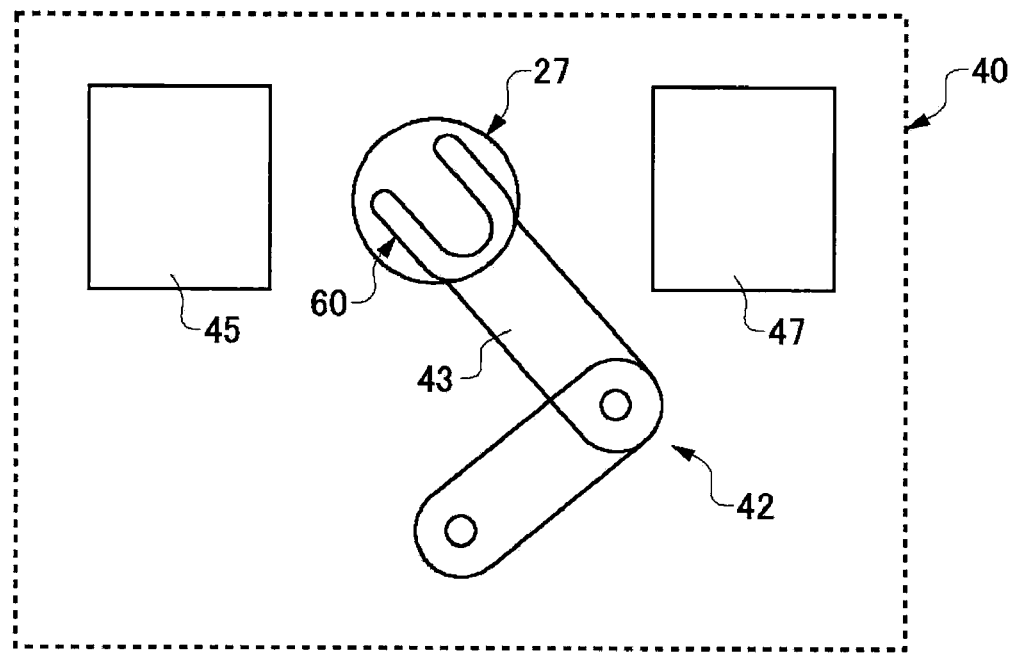
FIG. 3B is a schematic view of one step performed by the manufacturing apparatus.

Transportation Step and Detection of Misalignment Between Wafers (S5):

As shown in FIG. 3B, in the manufacturing apparatus 40 that manufactures the semiconductor apparatus, the temporarily fixed block 27 is transported from the stacking step executing section 45 to the pressure applying and heating step executing section 47. The transport of the block 27 is performed by the transport arm 43 of the transport apparatus 42. During the transport period, that is, the period from when the block 27 begins being transported from the stacking step executing section 45 to when the block 27 arrives at the pressure applying and heating step executing section 47 and the pressure applying and heating step begins, a method described further below is used to detect the possibility of misalignment occurring between the two wafers 11.

The transport apparatus 42 controls the operation of the transport arm 43 such that misalignment does not occur between the wafer holders 21 and the wafers 11 in the transported block 27. Even so, misalignment might be caused by sudden stoppage of the transport apparatus 42 when a control system above the transport apparatus 42 detects some kind of abnormality.

In this case, the movement of the transport arm 43 is stopped suddenly regardless of the transport apparatus 42, causing a large acceleration of the wafer holders 21 and wafers 11 during transport. Also, if the power supply is suddenly cut for some reason, the control of the transport apparatus 42 is disabled, causing the transport arm 43 to stop and resulting in a large acceleration of the wafer holders 21 and wafers 11.

If the transport apparatus 42 is provided with a plurality of independently controlled actuators, each actuator is controlled such that wafer holder 21 misalignment does not occur. However, there are cases where the tolerance of each actuator is overlapped such that the transported wafer holders 21 accelerate beyond a setting amount, which causes a large acceleration of the block 27.

In such a case, the transport arm tip 60 is provided with an acceleration sensor 64, for example, that can detect the possibility of misalignment by detecting the acceleration actually imparted to the block 27. On the other had, if a control system of the transport apparatus 42 detects an abnormality of some sort, the output of the acceleration sensor 64 can be referenced to detect whether the abnormality affects the block 27.

Misalignment Possibility Judging Step (S6):

In the misalignment possibility judging step (S6), a judgment is made concerning the detected possibility of misalignment. If the detected acceleration is below a threshold value indicating that there is no possibility of misalignment, the process moves to the pressure applying and heating step (S7). In other words, the judgment concerning the possibility of misalignment based on acceleration may be performed immediately prior to the initiation of the pressure applying and heating step. As a result, the performance of the pressure applying and heating step on a misaligned block 27 is prevented, thereby preventing a drop in the yield.

On the other hand, if the detection result indicates there is a possibility that the two wafers 11 are misaligned and the alignment precision necessary for the layered bonding is not ensured, the pressure applying and heating step (S7) is performed after returning the block 27 to the stacking step executing section 45 and repeating the steps from S3 to S5. As a result, precise alignment of the wafers 11 can be ensured.

The actual transport of a block 27 that is possibly misaligned to the pressure applying and heating step executing section 47 may be stopped. Instead of stopping transport of the block 27, the operation of the pressure applying and heating step executing section 47 may be stopped. Therefore, a block 27 that is possibly misaligned is removed from the transportation path and instead transported to a different region that is described further below.

Such a block 27 may be transported to a region other than the pressure applying and heating step executing section 47 by the transport apparatus 42. In this case, the block 27 may accumulate the possibly-misaligned wafers in a wafer cassette or the like designed for this purpose, without performing the pressure applying and heating step. Furthermore, if the possibly-misaligned blocks 27 are transported to a region other than the pressure applying and heating step executing section 47, the steps from S3 to S5 may be performed for other wafers 11.

Even if the possibility of misalignment is detected, that does not actually mean that the block 27 is misaligned. Such a block 27 that is not actually misaligned is examined to detect whether misalignment has occurred, and can move to the pressure applying and heating step without repeating the stacking step. As a result, the number of times that the stacking step is repeated can be decreased, thereby enhancing the throughput when manufacturing layered semiconductor apparatuses.

If a state of a wafer 11 changes during the stacking step, e.g. if surface quality of the bonded surface changes, it might be impossible to re-perform the stacking step for the misaligned block 27 in this state. In such a case, the stacking step is re-performed after a process is performed to polish the surface of the wafer 11, for example. As a result, the quality of the block 27 on which the stacking step is re-performed is improved, thereby further increasing the yield when manufacturing layered semiconductor apparatuses.

Figure 3C:
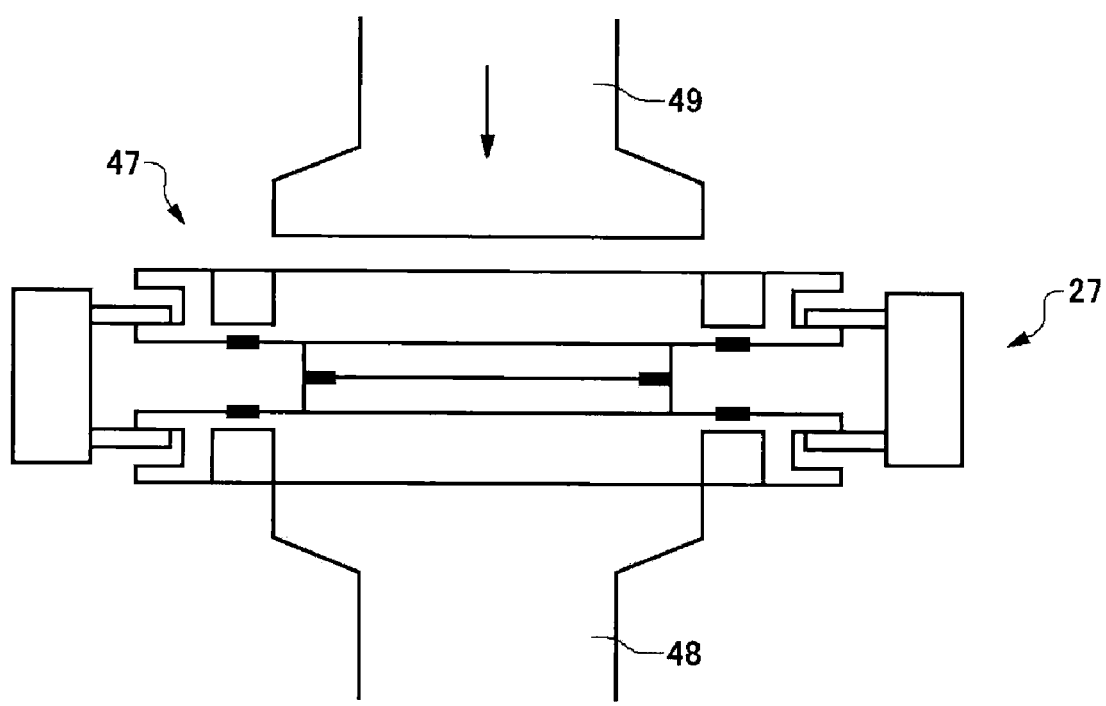
FIG. 3C is a schematic view of one step performed by the manufacturing apparatus.
Figure 4:
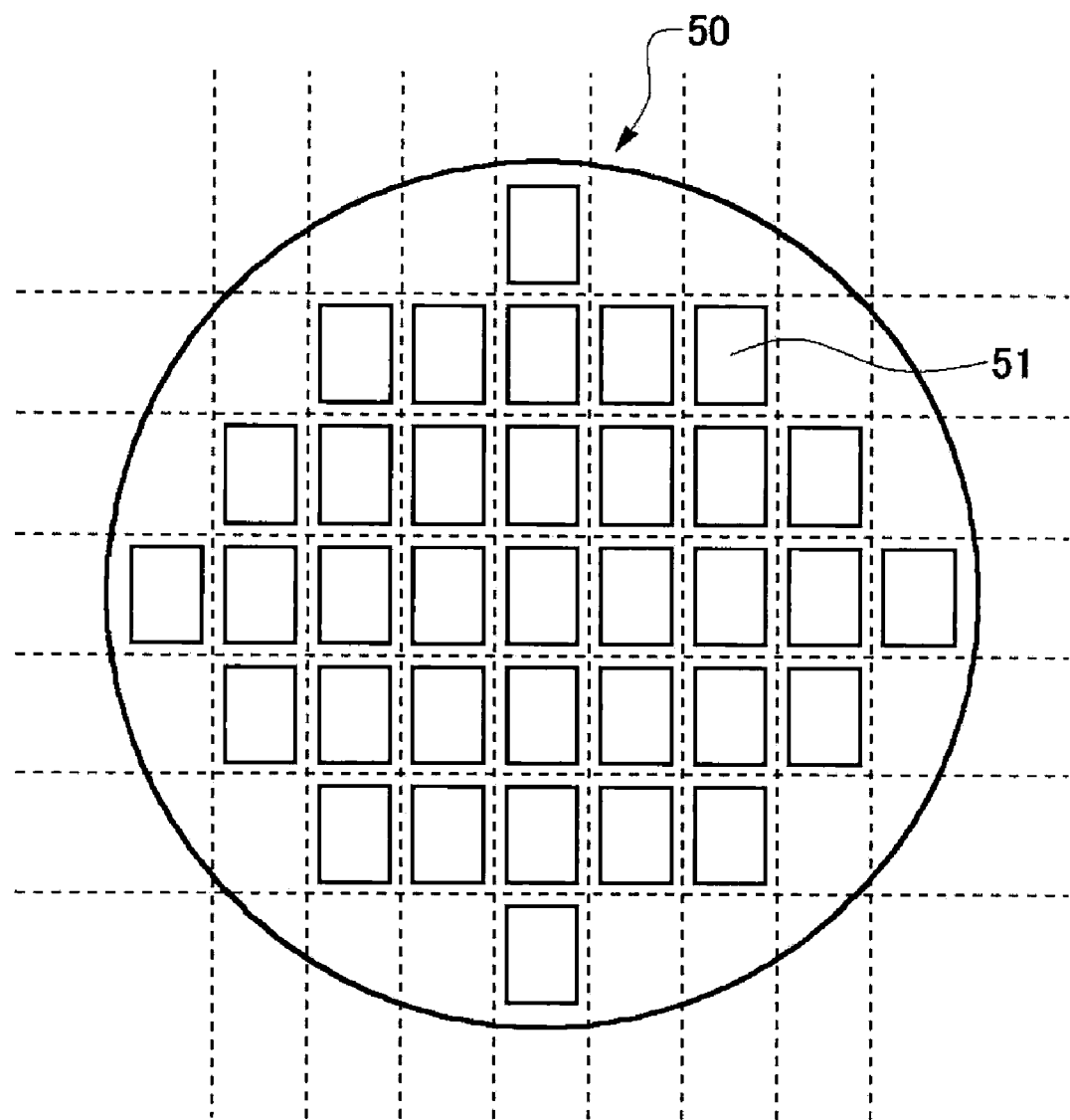
FIG. 4 is a schematic view of one step performed by the manufacturing apparatus.

Pressure Applying and Heating Step (S7):

The block 27 transported to the pressure applying and heating step executing section 47 is loaded in the pressure applying and heating step executing section 47, the degree of parallelization between the upper pressure applying plate 49 and the lower pressure applying plate 48 of the pressure applying and heating step executing section 47 is adjusted, and the upper pressure applying plate 49 is pressed toward the lower pressure applying plate 48 using a hydraulic cylinder, for example, as shown in FIG. 3C. After the two wafers 11 have been pressed by the wafer holders 21, the wafers 11 are heated by heaters housed in the wafer holders 21 and the electrodes are bonded to form the layered wafer body 50, as shown in FIG. 4

An adhesive agent or the like may be used when affixing the wafers 11 to each other in the pressure applying and heating step. In such a case, the heating of the block 27 by the pressure applying and heating step executing section 47 can be omitted.

The pressure applying and heating step executing section 47 may have a configuration for transporting the block 27 internally. As a result, even after the block 27 is transported into the pressure applying and heating step executing section 47, misalignment might occur in the block 27. Therefore, a step may be included to detect the possibility of misalignment prior to the initiation of the pressure applying process.

When the possibility of misalignment is detected in this step, the operation of the pressure applying and heating step executing section 47 may be stopped and the block 27 may be transported to another region without undergoing the pressure applying and heating step. In the same manner as described above, the transported blocks 27 may be realigned or may be transported and accumulated in a prescribed region after being examined. As a result, the manufacturing yield of layered semiconductor apparatuses is improved.

Dicing Step (S8):

The layered wafer body 50, which is formed by layering a prescribed number of wafers 11 and bonding the electrodes, is diced to be separated into individual chips 51, as shown in FIG. 4. The dicing can be realized by cutting the layered wafer body 50 along the dotted lines shown in FIG. 4, for example, using a widely known dicing blade.

As described above, by using the layered 3-dimensional semiconductor apparatus manufacturing apparatus and manufacturing method according to the embodiments of the invention, a drop in the yield of layered 3-dimensional semiconductor apparatuses due to bonding defects caused by misalignment during transport can be prevented by changing the steps when the possibility of misalignment between transported stacked wafers 11 is detected.

Therefore, a transport method is realized in which, when wafers 11 to be stacked are held by a pair of wafer holders 21, which are aligned by the stacking step executing section 45, and transported from the stacking step executing section 45 to the pressure applying and heating step executing section 47, a judgment can be made concerning the possibility that misalignment greater than a threshold amount occurs between the wafers 11. If this possibility is judged to be high, the pair of wafer holders 21 are transported to a region other than the stacking step executing section 45.

The following is a description, referencing Figures, of embodiments of the transport method and transport apparatus for detecting the possibility of misalignment. In the following description, components that have appeared previously are given the same reference numerals and redundant explanation is omitted.

First Embodiment

Figure 5A:
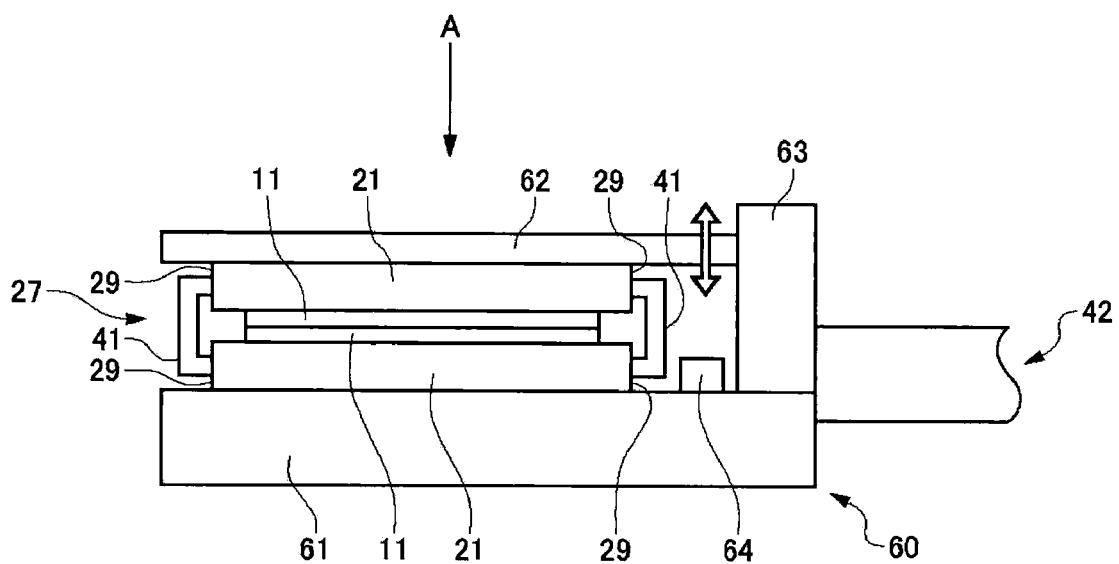
FIG. 5A shows the transport apparatus 42 as seen from the side when the block 27 is loaded therein.
Figure 5B:
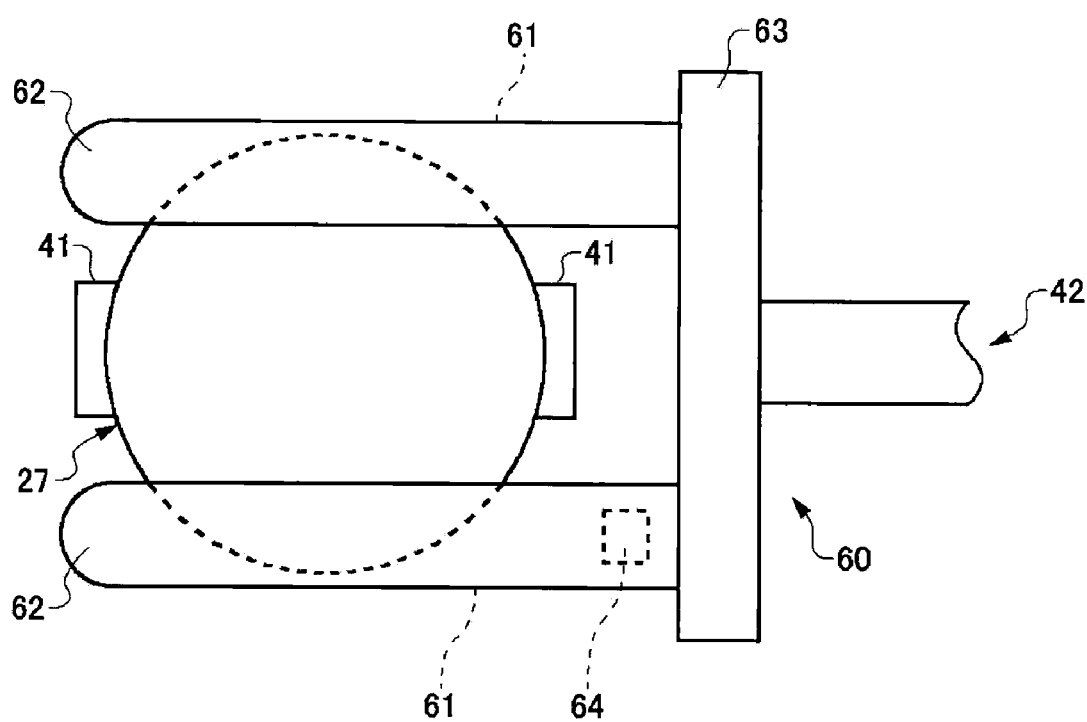
FIG. 5B shows the transport apparatus 42 as seen from the direction indicated by A in FIG. 5A when the block 27 is loaded therein.

FIGS. 5A and 5B show the transport apparatus 42 that detects misalignment according to the first embodiment. FIGS. 5A and 5B show the transport apparatus 42 when a block 27 is loaded therein, as shown in FIG. 3B. FIG. 5A shows the transport apparatus 42 as seen from the side, and FIG. 5B shows the transport apparatus 42 as seen from the direction indicated by A in FIG. 5A.

In the state shown by FIGS. 5A and 5B, a block 27 is loaded into the transport arm tip 60. This block 27 is obtained by the temporary fixing apparatus 41 temporarily fixing two wafers 11 being aligned by the stacking step executing section 45 and having surfaces contacting each other, as shown in FIG. 3B.

The transport arm tip 60 includes a lower support plate 61, an upper support plate 62, and a support pillar 63 that supports the lower support plate 61 and the upper support plate 62. The upper support plate 62 moves in a direction indicated by the arrows near the support pillar 63 in FIG. 5A, i.e. an up and down direction when viewing the plane of FIG. 5A.

The two wafers 11 to be layered are each held by the corresponding wafer holder 21 using electrostatic adsorption, vacuum suction, or the like, and the two wafers 11 are aligned using the steps described above.

After the wafers 11 are aligned, the wafer holders 21 are temporarily fixed by the temporary fixing apparatus 41 to form the block 27. The block 27 is fixed to the lower support plate 61 of the transport arm tip 60 by electrostatic adsorption or vacuum suction.

After the block 27 is fixed to the lower support plate 61, the upper support plate 62 applies a pressing force from above while the block 27 is being sandwiched. As a result, the block 27 is pressed into the state shown in FIG. 3B, in which the block 27 can be transported from the stacking step executing section 45 to the pressure applying and heating step executing section 47. While the block 27 is sandwiched between the lower support plate 61 and the upper support plate 62, the block 27 may be fixed to the upper support plate 62 by electrostatic adsorption or vacuum suction.

When the transport arm 43 (see FIG. 3B) transports the block 27, the block 27 is accelerated when movement begins, during movement, and when movement stops. If the block 27 experiences a large amount of acceleration, the possibility of misalignment occurring between the two wafers 11 in the temporarily-fixed block 27 becomes more likely, as described further below in relation to FIG. 6. If misaligned wafers 11 are bonded, the bonding is fixed without a connection being achieved between the electrodes of the wafers 11. Such a bonding decreases the yield of the 3-dimensional semiconductor apparatuses. To prevent this, the first embodiment detects misalignment based on the acceleration during transport.

In the first embodiment, the acceleration sensor 64 for detecting the acceleration of the transport arm tip 60 during transport is provided near the support pillar 63 on the surface of the lower support plate 61 onto which the block 27 is loaded. The acceleration sensor 64 detects the acceleration experienced by the block 27 during transport. The acceleration detected by the acceleration sensor 64 is transmitted to a control apparatus, and the possibility of misalignment is judged by the control apparatus based on the relation between acceleration and misalignment amount measured previously, as shown in FIG. 6.

Figure 6:
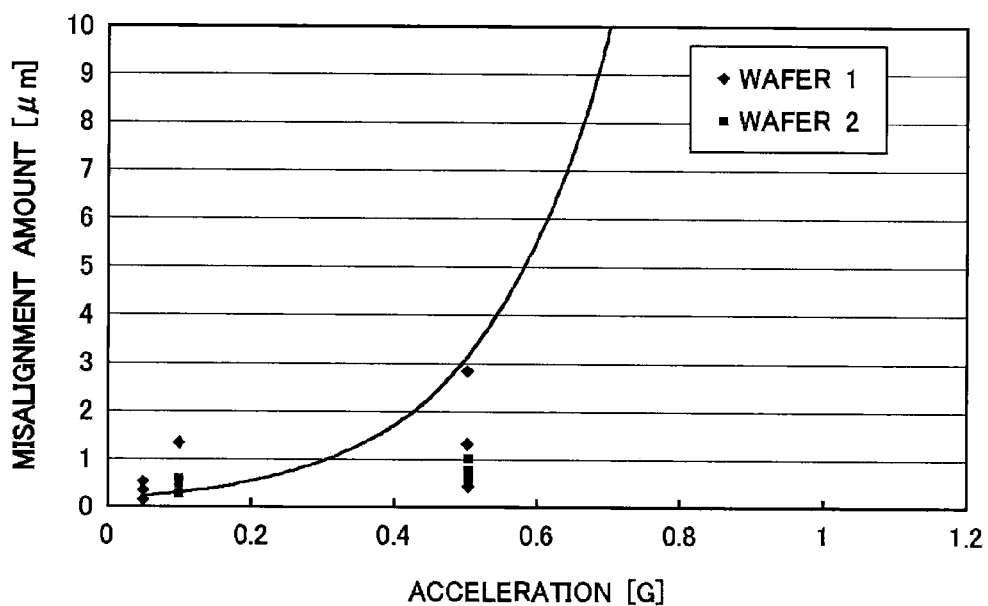
FIG. 6 is a graph showing the correlation between the acceleration imparted by the transport apparatus 42 and the amount of misalignment occurring between the wafers 11.

FIG. 6 is a graph showing the correlation between the acceleration imparted by the transport arm 43 of the transport apparatus 42 and the amount of misalignment occurring between the wafers, based on experimentally measured results. As shown in FIG. 6, there is a correlation between the acceleration experienced by the block 27 and misalignment. Accordingly, the possibility of misalignment in the block 27 can be detected by comparing the acceleration detected by the acceleration sensor 64 to a threshold value.

The possibility of misalignment can be detected by comparing the detected acceleration to the threshold value of the acceleration detected during transport, based on the relationship between the acceleration and misalignment measured in advance. If there is a possibility of misalignment, the pressure applying and heating step (S7) is not performed for the block 27. A possibly-misaligned block 27 is transported to a region other than the pressure applying and heating step executing section 47, and is examined with regard to whether misalignment has occurred, for example.

If the examination indicates no misalignment, the block 27 is transported to the pressure applying and heating step executing section 47 and the pressure applying and heating step (S7) is performed thereon. If the examination indicates misalignment, the stacking step is performed again to prevent a drop in yield due to misalignment. Furthermore, the misaligned block 27 can be dismantled, and the stacking step can then be performed again after some type of processing, such as polishing of the wafers 11, has been performed.

In addition, the yield of the manufactured product is further improved. A block 27 that is not misaligned can undergo the pressure applying and heating step without being re-stacked, thereby increasing the throughput when manufacturing the layered 3-dimensional semiconductor apparatuses. In this way, a decrease in the yield due to wafer 11 misalignment occurring during transport from the stacking step executing section 45 to the pressure applying and heating step executing section 47 can be prevented.

The acceleration during transport can be detected as long as the acceleration sensor 64 is provided on at least one of the two lower support plates 61. The acceleration sensor 64 can achieve the same result by being provided on components other than the lower support plates 61, such as the support pillar 63 or the upper support plate 62. Furthermore, in addition to acceleration in an x-y direction parallel to the plane of FIG. 3B, the acceleration sensor 64 may detect acceleration in the z-direction, which is perpendicular to the plane of FIG. 3B.

The misalignment possibility judgment (S6) can be performed any time prior to initiation of the pressure applying and heating step (S7). Therefore, if the detection results are constantly monitored and acceleration that might cause misalignment is detected before the block 27 reaches the pressure applying and heating step executing section 47, the transport of the block 27 to the pressure applying and heating step executing section 47 can be stopped and the block 27 can be immediately examined or transported to undergo the stacking step again.

First Modification

Figure 7:
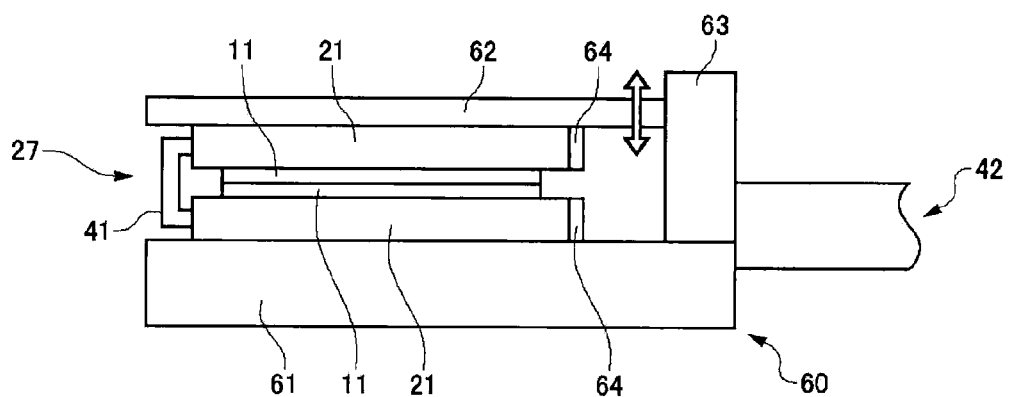
FIG. 7 shows a first modification of the present embodiment.

FIG. 7 shows a first modification of the present embodiment. Aside from the points described below, the first modification has the same configuration as the first embodiment, and therefore redundant explanation is omitted.

In the first modification, the acceleration sensor 64 is provided on an outer periphery of at least one of the two wafer holders 21 forming the block 27. FIG. 7 shows an example in which both of the wafer holders 21 are provided with the acceleration sensor 64.

The present modification, in the same manner as described above, detects the possibility of misalignment corresponding to detected acceleration based on the relationship between acceleration and misalignment amount shown in FIG. 6, which is stored in the control apparatus. Therefore, the transport apparatus 42 of the present modification can prevent a drop in yield caused by misalignment during transport.

The acceleration sensor 64 used in the first embodiment and first modification may be a widely known acceleration sensor such as a device using semiconductor distortion resistance elements. However, if the acceleration sensor 64 is provided to the wafer holders 21, the acceleration sensor 64 desirably has a high heat resistance since the acceleration sensor 64 is also heated during the pressure applying and heating step (S7). The relationship between acceleration and misalignment amount shown in FIG. 6 may be stored in a memory of the control apparatus as a conversion table or as an approximation function.

Second Embodiment

Figure 8:
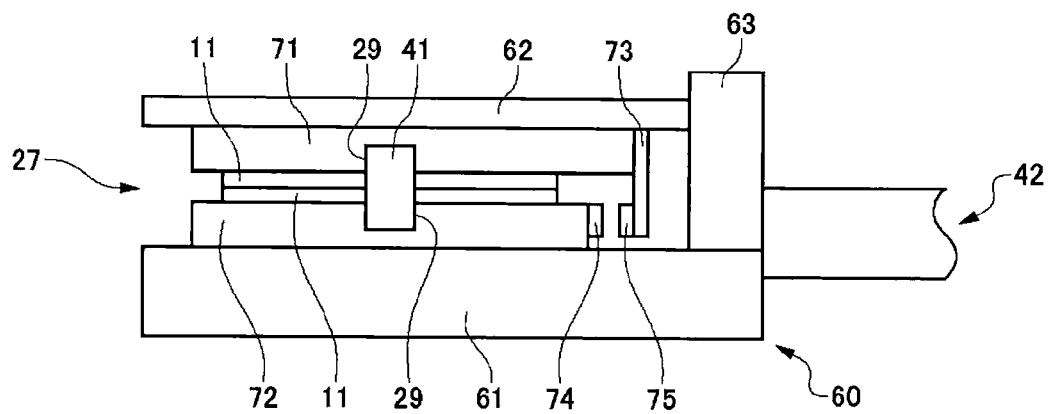
FIG. 8 shows the transport apparatus 42 according to the second embodiment, as viewed from the side in a state where the block 27 is loaded therein.

FIG. 8 shows the transport apparatus 42 that can detect misalignment according to the second embodiment, as viewed from the side in a state where the block 27 is loaded in the transport apparatus 42 as shown in FIG. 3B. The transport apparatus 42 show in FIG. 8 has the same configuration as the transport apparatus 42 according to the first embodiment, and therefore redundant explanation is omitted.

In the second embodiment, there are two wafer holders 71 and 72, and a reference surface 73 is formed on the wafer holder 71. The reference surface 73 is provided with a gap sensor 75 for measuring a space between the reference surface 73 and a reference surface 74 of the other wafer holder 72. The gap sensor 75 is a sensor that detects a change in a gap according to a change in electrostatic capacitance, for example, and may be a widely known sensor such as an optical sensor using triangulation.

The second embodiment can use the gap sensor 75 to directly measure the relative misalignment between the two stacked wafers 11, and therefore has a lower misalignment measurement error than the first embodiment.

If the misalignment detected by the gap sensor 75 is greater than or equal to a threshold value, the block 27 is returned to the stacking step executing section 45 and is then transported to the pressure applying and heating step executing section 47 after the realignment is performed, thereby preventing a drop in the yield.

In the first embodiment, the first modification, and the second embodiment, the misalignment between the two wafer holders 21 forming the block 27 can be detected continuously during transport of the block 27 from the stacking step executing section 45 to the pressure applying and heating step executing section 47, and the block 27 can be returned to the stacking step executing section 45 and realigned as soon as the misalignment amount exceeds the threshold value. Therefore, the time necessary for realignment when misalignment occurs is shortened, thereby minimizing the drop in processing ability.

Third Embodiment

Figure 9:
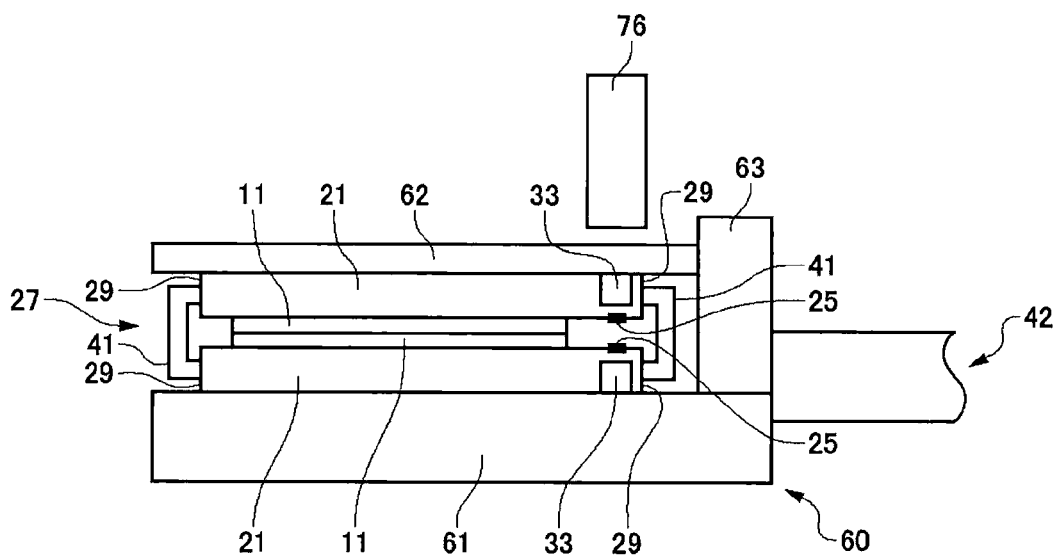
FIG. 9 shows the transport apparatus 42 according to the third embodiment, as viewed from the side in a state where the block 27 is loaded therein.

FIG. 9 shows the transport apparatus 42 that can detect misalignment according to the third embodiment, as viewed from the side in a state where the block 27 is loaded in the transport apparatus 42 as shown in FIG. 3B. The transport apparatus 42 show in FIG. 9 has the same configuration as the transport apparatus 42 according to the first embodiment, and therefore redundant explanation is omitted.

In FIG. 9, the positional relationship between the wafers is obtained by monitoring the reference marks 25 on the wafer holders 21 when two wafers 11 are stacked as described in FIG. 2C, and the relative positions of the wafers 11 are adjusted. In the third embodiment, the misalignment between the two wafers 11 during transport is detected by using a microscope 76 provided to the pressure applying and heating step executing section 47 to monitor the positional relationship between the two reference marks 25 used for alignment after transportation from the stacking step executing section 45 to the pressure applying and heating step executing section 47. This method simply involves providing the pressure applying and heating step executing section 47 with the microscope 76, and therefore has the benefit of lower cost.

Fourth Embodiment

Figure 10:
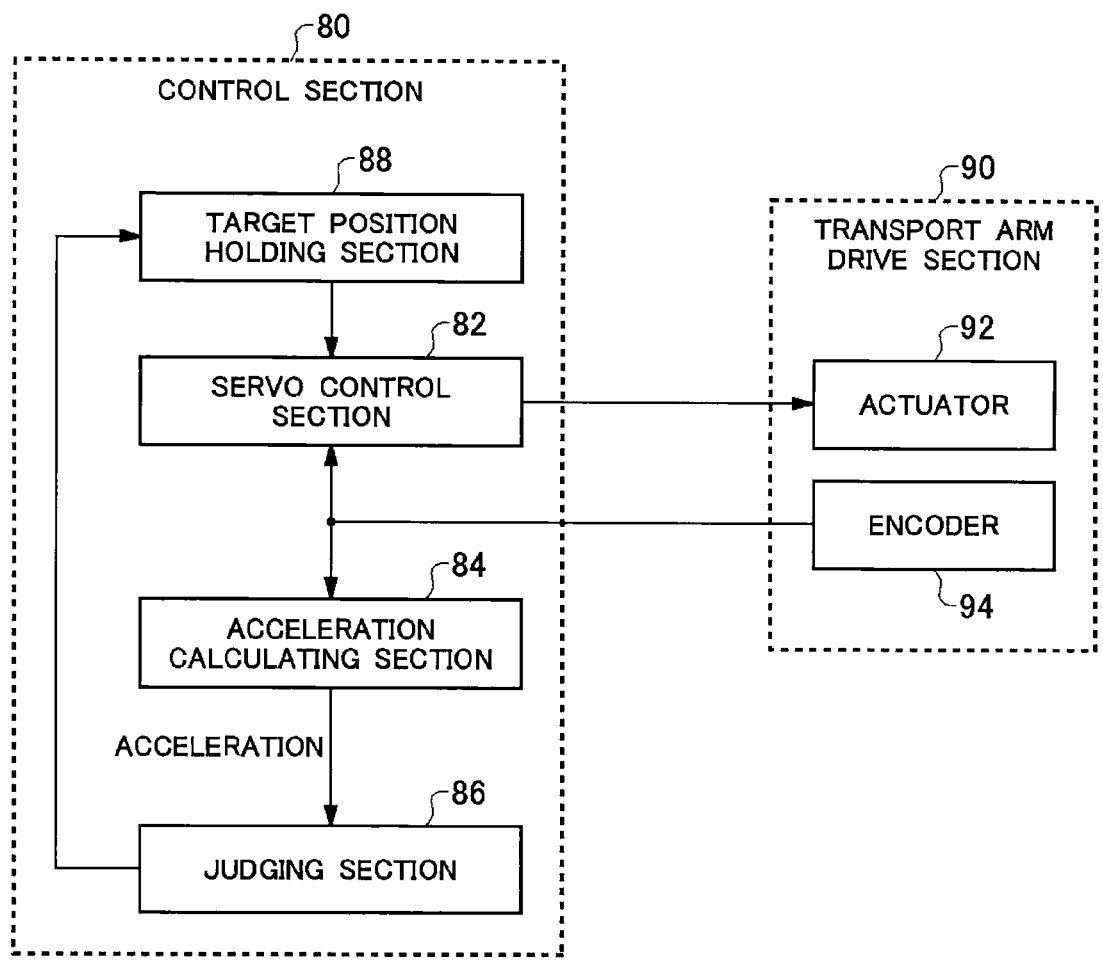
FIG. 10 is a schematic view of a control section 80 and the transport apparatus 42 according to the fourth embodiment.

FIG. 10 shows a schematic view of a control section 80 and the transport apparatus 42 according to the fourth embodiment. The configuration of the transport apparatus 42 is the same as the configuration of the transport apparatus 42 of any of the other embodiments, and therefore redundant explanation is omitted. As shown in FIG. 10, the transport apparatus 42 is provided with the control section 80 and a transport arm drive section 90.

The control section 80 includes a servo control section 82, an acceleration calculating section 84, a judging section 86, and a target position holding section 88. The transport arm drive section 90 includes an actuator 92 that causes each part of the transport arm 43 to operate and an encoder 94 that measures a movement amount of the actuator 92. The actuator 92 is driven by pressure of a working fluid or electricity. The encoder 94 may be formed using a linear encoder, a rotary encoder, or the like.

In the control section 80, the target position holding section 88 holds information indicating a position to be reached by the transport arm 43. The servo control section 82 makes a comparison between a target position acquired from the target position holding section 88 and the movement amount of the actuator 92 received from the encoder 94, and supplies the actuator 92 with drive power. In this way, the actuator 92 can ensure that the transport arm 43 arrives at the target position.

In the control section 80, the acceleration calculating section 84 also receives the movement amount of the actuator 92 from the encoder 94. The acceleration calculating section 84 can calculate the acceleration caused by the transport arm 43 by differentiating the information indicating the movement amount, for example. The judging section 86 can judge whether there is the possibility of misalignment between the wafers 11 in the block 27 transported by the transport arm 43 based on the acceleration of the transport arm 43 received from the acceleration calculating section 84.

If the judging section 86 detects that the acceleration exerted on the block 27 by the transport arm 43 is greater than a prescribed threshold value, the judging section 86 sets the target position in the target position holding section 88 to be a region other than the pressure applying and heating step executing section 47. In this way, the block 27 can be transported to a region where examination, re-processing, disposal, or the like can be performed.

The control section 80 described above can be further provided with the acceleration sensor 64 described in the first embodiment. In other words, the servo control section 82 can control the transport arm drive section 90 to move the transport apparatus 42 within a range of acceleration in which misalignment does not occur between the wafers 11 of the block 27. It should be noted that the transport apparatus 42 includes a plurality of movable joints and the like, and so the acceleration of the transport arm tip 60 does not necessarily match the acceleration predicted by the servo control section 82.

Therefore, even if the servo control section 82 performs the correct control, the acceleration of the transport arm tip 60 might exceed the acceleration at which misalignment of the wafers 11 begins to occur. To solve this problem, the acceleration sensor 64 is provided to the transport arm tip 60 to detect the actual acceleration of the transport arm tip 60.

In this case, even if the output of the acceleration calculating section 84 is not above the threshold value, the judging section 86 judges that there is possible misalignment when the value detected by the acceleration sensor 64 is above the threshold value. Furthermore, even when the output of the acceleration calculating section 84 is above the threshold value, the judging section 86 judges that there is no possible misalignment when the value detected by the acceleration sensor 64 is not above the threshold value, so that the pressure applying and heating step can be initiated. In this way, even if an abnormality, including an abnormality in the transport, is detected, the pair of wafer holders 21 may still be transported to the pressure applying and heating step executing section 47 if there is judged to be no possibility of misalignment. Therefore, the possibility of misalignment can be more accurately judged.

Figure 11:
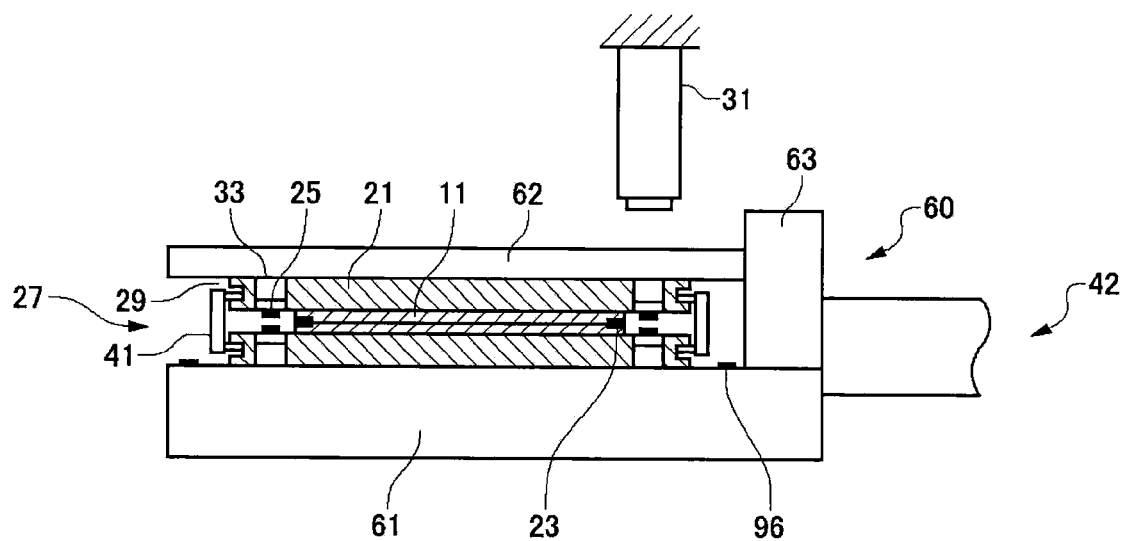
FIG. 11 is a side view of the transport apparatus 42 according to the fifth embodiment when the block 27 is loaded therein.

FIG. 11 is a side view of the transport apparatus 42 according to the fifth embodiment when the block 27 is loaded therein. Explanations of portions of the fifth embodiment common to other embodiments are omitted. As shown in FIG. 11, the transport apparatus 42 includes reference marks 96 on the top surface of the lower support plate 61. Therefore, misalignment of the wafers 11 can be detected by detecting the relative positions of the reference marks 96 on the lower support plate 61 and the reference marks 25 of the wafer holders 21 loaded in the transport arm tip 60.

Detecting the relative positions of the reference marks 25 and 96 can be performed using a microscope 31, in the same manner as described in the third embodiment for detecting the relative positions of the reference marks 25 of the two wafer holders 21. In other words, the misalignment of the block 27 caused by the transport can be detected by measuring the relative positions of the reference marks 25 and 96 both before the transport apparatus 42 begins transporting the block 27 and after the transportation. In this way, the possibility of misalignment between the wafers 11 of the block 27 can be known.

The reference marks 96 provided to the transport arm tip 60 are not limited to mark patterns such as the alignment marks 23 of the wafers 11 that can be detected by a microscope. Instead of the microscope 31 detecting the reference marks 96, the reference marks 96 can be detected by a magnetic sensor, an electric field sensor, am electrostatic capacitance sensor, an interferometer, or the like using magnetism, electrodes, reflection, or the like. Furthermore, using an image capturing apparatus instead of the microscope 31 enables detection of the relative positions based on an image of the transport arm tip 60 itself.

As described above, a judgment is made concerning the possibility of misalignment between two wafers 11 due to transport, and if the judgment indicates the possibility of misalignment, an operator is informed of this fact and the alignment is checked, for example, prior to the process performed by the pressure applying and heating step executing section 47, thereby preventing a drop in the yield of layered 3-dimensional semiconductor apparatuses due to misalignment. Furthermore, since blocks 27 having no possibility of misalignment can continue to be processed, the throughput of the semiconductor apparatus manufacturing apparatus is improved.

Therefore, by detecting the misalignment between wafers caused by transport, the drop in yield due to bonding defects between wafers in a manufactured semiconductor apparatus can be prevented. The above description involves stacking semiconductor apparatuses, but it is obvious that the same method and apparatus can be used to bond substrates other than semiconductor apparatuses.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A bonding method comprising:
aligning a plurality of wafers in an alignment section;
transporting the plurality of wafers from the alignment section to a bonding section;
bonding the plurality of wafers in the bonding section; and
judging, before the bonding step is performed, whether misalignment between the wafers has occurred after the aligning step and before the bonding step;
wherein if the judgment in the judging step indicates that misalignment has occurred, bonding is not performed in the bonding step.

2. The bonding method of claim 1, wherein
if the judgment in the judging step indicates that misalignment has occurred, the plurality of wafers are transported to a region other than the bonding section.

3. The bonding method of claim 1, wherein
in the judging step, whether misalignment has occurred is judged before the plurality of wafers are transported to the bonding section, and
if the judgment in the judging step indicates that misalignment has occurred, the transporting the plurality of wafers to the bonding section is stopped.

4. The bonding method of claim 3, further comprising
if the judgment in the judging step indicates that misalignment has occurred, realigning the plurality of the wafers.

5. The bonding method of claim 1, wherein
in the judging step, whether misalignment has occurred is judged after the plurality of wafers are transported to the bonding section, and
if the judgment in the judging step indicates that misalignment has occurred, the plurality of wafers are transported from the bonding section before bonding in the bonding step starts.

6. The bonding method of claim 1, wherein
at least one wafer of the plurality of wafers is held by a wafer holder and the at least one wafer held by the wafer holder is aligned with and stacked with another wafer of the plurality of wafers in the aligning section.

7. The bonding method of claim 6, wherein
in the judging step, whether misalignment has occurred is judged based on acceleration of the wafer holder.

8. The bonding method of claim 6, wherein
in the judging step, whether misalignment has occurred is judged based on acceleration of a transporting section that transports the wafer holder.

9. The bonding method of claim 6, wherein
the wafer holder is transported to the transporting section together with another wafer holder in a state that the plurality of wafers are held between the wafer holder and the other wafer holder, and
in the judging step, whether misalignment has occurred is judged based on relative positions of the pair of wafer holders.

10. The bonding method of claim 6, wherein
the wafer holder is transported to the transporting section together with another wafer holder in a state that the plurality of wafers are held between the wafer holder and the other wafer holder, and
in the judging step, whether misalignment has occurred is judged based on relative positions of (i) a transporting section that transports the pair of wafer holders and (ii) one of the pair of wafer holders.

11. The bonding method of claim 6, wherein
even in a case where an abnormality, including a transportation abnormality, is detected, if it is judged that misalignment has not occurred, the wafer holder is transported to the bonding section and the wafers are affixed to each other.

12. The bonding method of claim 1, wherein
the judging step comprises judging whether misalignment between the wafers has occurred during transporting the wafers.

13. A bonding method comprising:
aligning a plurality of wafers in an alignment section;
transporting the plurality of wafers from the alignment section to a bonding section;
bonding the plurality of wafers in the bonding section;
judging, before the bonding step is performed, whether misalignment between the wafers has occurred after the aligning step and before the bonding step; and
examining to detect whether misalignment has occurred if the judgment in the judging step indicates that misalignment has occurred, wherein
if misalignment is not detected in the examination step, the bonding step is performed without repeating the aligning step.

14. A bonding method comprising:
aligning a plurality of wafers in an alignment section;
bonding the plurality of wafers in the bonding section; and
judging, before the bonding step is performed, whether misalignment between the wafers has occurred after the aligning step and before the bonding step, wherein
if the judgment in the judging step indicates that misalignment has occurred, bonding is not performed in the bonding step.

15. The bonding method of claim 14, wherein
the judging step comprises judging whether misalignment between the wafers has occurred during transporting the wafers.

16. The bonding method of claim 14, wherein
the aligning step, the bonding step and the judging step are performed in the same apparatus.

17. A bonding method comprising:
aligning a plurality of wafers in an alignment section;
holding the plurality of wafers by a wafer holder;
transporting the wafer holder holding the plurality of wafers from the alignment section to a bonding section;
bonding the plurality of wafers held by the wafer holder in the bonding section; and
judging, before the bonding step is performed, whether misalignment between the wafers has occurred after the aligning step and before the bonding step, wherein
if the judgment in the judging step indicates that misalignment has occurred, bonding is not performed in the bonding step.

18. The bonding method of claim 17, wherein
the judging step comprises judging whether misalignment between the wafers has occurred during transporting the wafers.

19. A bonding method comprising:
aligning a plurality of wafers in an alignment section;
holding the plurality of wafers by a wafer holder;
bonding the plurality of wafers held by the wafer holder in a bonding section; and
judging, before the bonding step is performed, whether misalignment between the wafers has occurred after the aligning step and before the bonding step, wherein
if the judgment in the judging step indicates that misalignment has occurred, bonding is not performed in the bonding step.

20. The bonding method of claim 19, wherein
the judging step comprises judging whether misalignment between the wafers has occurred during transporting the wafers.

21. The bonding method of claim 20, wherein
the aligning step, the bonding step and the judging step are performed in the same apparatus.

22. A bonding apparatus comprising:
an alignment section operable to align a plurality of wafers;
a bonding section operable to bond the plurality of wafers aligned by the alignment section;
a transport section operable to transport the plurality of wafers aligned by the alignment section from the alignment section to the bonding section; and
a judging section operable to judge, before the wafers are bonded in the bonding section, whether misalignment between the wafers has occurred after the wafers are aligned by the alignment section and before the wafers are bonded in the bonding section, wherein
if the judgment by the judging section indicates that misalignment has occurred, bonding is not performed in the bonding section.

23. The bonding apparatus of claim 22, wherein
if the judgment by the judging section indicates that misalignment has occurred, the plurality of wafers are transported to a region other than the bonding section.

24. The bonding apparatus of claim 22, wherein
the judging section judges whether misalignment between the wafers has occurred during transporting the wafers.

25. The bonding apparatus of claim 22, wherein
the judging section makes the judgment before the plurality of wafers are transported to the bonding section, and
if the judgment by the judging section indicates that misalignment has occurred, the transporting the plurality of wafers to the bonding section is stopped.

26. The bonding apparatus of claim 22, wherein
the judging section makes the judgment after the plurality of wafers are transported to the bonding section, and
if the judgment by the judging section indicates that misalignment has occurred, the plurality of wafers are transported from the bonding section before bonding in the bonding section starts.

27. The bonding apparatus of claim 22, wherein
if the judgment by the judging section indicates that misalignment has occurred, the plurality of the wafers are realigned.

28. The bonding apparatus of claim 22, further comprising
an examining section operable to detect whether misalignment has occurred if the judgment by the judging section indicates that misalignment has occurred, wherein
if misalignment is not detected by the examining section, the plurality of wafers are transported to the bonding section.

29. The bonding apparatus of claim 22, wherein
at least one wafer of the plurality of wafers is held by a wafer holder and the at least one wafer held by the wafer holder is aligned with and stacked with another wafer of the plurality of wafers in the aligning section.

30. The bonding apparatus of claim 29, wherein
the judging section judges whether misalignment has occurred based on acceleration of the wafer holder detected by an acceleration sensor mounted on the wafer holder.

31. The bonding apparatus of claim 29, wherein
the judging section judges whether misalignment has occurred based on acceleration of the wafer holder detected by an acceleration sensor mounted on the transport section.

32. The bonding apparatus of claim 29, wherein
the judging section includes a servo control section and judges whether misalignment has occurred based on acceleration of the wafer holder detected by an encoder of the servo control section.

33. The bonding apparatus of claim 29, wherein
the wafer holder is transported to the transport section together with another wafer holder in a state that the plurality of wafers is held between the wafer holder and the other wafer holder, and
the judging section judges whether misalignment has occurred based on relative positions of the pair of wafer holders detected by a gap sensor mounted on the wafer holders.

34. The bonding apparatus of claim 29, wherein
the wafer holder is transported to the transporting section together with another wafer holder in a state that the plurality of wafers is held between the wafer holder and the other wafer holder, and
the judging section judges whether misalignment has occurred based on relative positions of the pair of wafer holders calculated from the position of each of the pair of wafer holders.

35. The bonding apparatus of claim 29, wherein
the wafer holder is transported to the transporting section together with another wafer holder in a state that the plurality of wafers is held between the wafer holder and the other wafer holder, and
the judging section judges whether misalignment has occurred based on relative positions of the transporting section and one of the pair of wafer holders.

36. The bonding apparatus of claim 29, wherein
even if an abnormality, including a transportation abnormality, is detected, if it is judged that misalignment has not occurred, the judging section causes the wafer holder to be transported to the bonding section.

37. A bonding apparatus comprising:
an alignment section operable to align a plurality of wafers;
a bonding section operable to bond the plurality of wafers aligned by the alignment section; and
a judging section operable to judge, before the wafers are bonded in the bonding section, whether misalignment between the wafers has occurred after the wafers are aligned by the alignment section and before the wafers are bonded in the bonding section, wherein
if the judgment by the judging section indicates that misalignment has occurred, bonding is not performed in the bonding section.

38. The bonding apparatus of claim 37, wherein
the judging section judging whether misalignment between the wafers has occurred during transporting the wafers.

39. A bonding apparatus comprising:
an alignment section operable to align a plurality of wafers;
a bonding section operable to bond the plurality of wafers aligned by the alignment section and held by one or more wafer holders; and
a judging section operable to judge, before the wafers are bonded in the bonding section, whether misalignment between the wafers has occurred after the wafers are aligned by the alignment section and before the wafers are bonded in the bonding section, wherein
if the judgment by the judging section indicates that misalignment has occurred, bonding is not performed in the bonding section.

40. The bonding apparatus of claim 39, wherein
the judging section judging whether misalignment between the wafers has occurred during transporting the wafers.

41. A bonding apparatus comprising:
an alignment section operable to align a plurality of wafers;
a bonding section operable to bond the plurality of wafers aligned by the alignment section;
a transport section operable to transport a wafer holder that holds the plurality of wafers aligned by the alignment section from the alignment section to the bonding section; and
a judging section operable to judge, before the wafers are bonded in the bonding section, whether misalignment between the wafers has occurred after the wafers are aligned by the alignment section and before the wafers are bonded in the bonding section, wherein
if the judgment by the judging section indicates that misalignment has occurred, bonding is not performed in the bonding section.

42. The bonding apparatus of claim 41, wherein
the judging section judging whether misalignment between the wafers has occurred during transporting the wafers.

* * * * *